United States Patent [19]

Gelbart et al.

[11] Patent Number: 5,208,818
[45] Date of Patent: May 4, 1993

[54] LASER SYSTEM FOR RECORDING DATA PATTERNS ON A PLANAR SUBSTRATE

[75] Inventors: Daniel Gelbart; Amos Michelson, both of Vancouver, Canada

[73] Assignee: Creo Products Inc., Burnaby, Canada

[21] Appl. No.: 805,756

[22] Filed: Dec. 12, 1991

[51] Int. Cl.$^5$ .................. H01S 3/13; G01D 15/10
[52] U.S. Cl. .................. 372/30; 372/9; 372/26; 372/109; 346/76 L; 346/108; 359/838; 359/846
[58] Field of Search ............ 372/9, 26, 30, 24, 25, 372/109, 107; 346/160, 76 L, 108; 385/129, 130, 147; 359/838, 846

[56] References Cited

U.S. PATENT DOCUMENTS

| | | | |
|---|---|---|---|
| 4,190,327 | 2/1980 | Hughes | 372/34 |
| 4,441,791 | 4/1984 | Hornbeck | 372/26 |
| 4,571,603 | 2/1986 | Hornbeck et al. | 346/160 |
| 5,049,901 | 9/1991 | Gelbart | 346/108 |
| 5,107,275 | 4/1992 | Tsuruoka et al. | 346/108 |

Primary Examiner—Brian Healy

[57] ABSTRACT

A processless phototool generator uses a pulsed excimer laser to image a deformable mirror spatial light modulator onto a thin ablateable coating on a quartz substrate. The light pulse ablates and clears the coating from selected areas according to the data pattern in the deformable mirror array. Exposure uniformity is enhanced by a two dimensional overwriting method. The high image reduction ratio enables high power densities on the substrate without exceeding the permissible power density on the deformable mirror array. Since the recording is processless (i.e. no development required) the generated image can be verified immediately after writing. The last feature is of particular importance in phase-shift masks.

9 Claims, 3 Drawing Sheets

LASER SYSTEM FOR RECORDING DATA PATTERNS ON A PLANAR SUBSTRATE

BACKGROUND OF THE INVENTION

This invention relates to the generation of phototools and more specifically to the generation of masks and reticles used in the semiconductor industry.

Prior art in the semiconductor industry uses different methods to expose a layer of photoresist deposited on top of a metal layer in order to generate a phototool. After exposure the photoresist is developed and used as a mask for etching the metal layer (typically chrome deposited on quartz). Since a development process is involved, the pattern can not be inspected at the time of exposure. A second disadvantage of the development process is the potential increase in the number of defects caused by using a multi-step process. Prior attempts to generate processless phototools include ablation of a metal or polymer layer. These attempts were not completely successful since a very short wavelength, generated only be excimer lasers, is required for clean ablation. Excimer lasers have a low repetition rate, which has prevented their use in high data rate applications. Conventional light valves such as liquid crystals do not transmit well the short wavelength of the excimer lasers.

SUMMARY OF THE INVENTION

In accordance with the present invention a deformable mirror spatial light modulator is used together with a waveguide-type excimer laser to record a large number of data bits with each laser pulse. The deformable mirror light modulator is a device manufactured by Texas Instruments Inc. (Texas) and its principle of operation is covered by U.S. Pat. No. 4,441,791. A detailed description of its operation is given in the paper: "Deformable-Mirror Spatial Light Modulators" by L. J. Hornbeck (proceedings of the SPIE, volume 1150, 1989). No further details about this device will be given here. The deformable mirror array is imaged onto a polymer coated quartz substrate with a typical reduction ratio of about 100:1. Due to the large reduction ratio the power density on the deformable mirrors is thousands of times lower than on the polymer, thus the polymer can be ablated without damage to the mirrors. In order to avoid solid debris (mainly carbon) as a by-product of the ablation, the ablation is done in an atmosphere of an inert gas (to prevent combustion) or oxygen atmosphere (to complete the combustion of the solid debris). A two-level polymer coating can be used in order to generate a phase-shift mask. An objective of this invention is to provide a fast and processless method of generating phototools such as masks and reticles for the semiconductor industry. A further objective of the invention is to verify the phototool at the same time it is being generated by comparing the written data to the transmission of the phototool. Another objective of the invention is to generate and verify phase shift masks. Still another objective of the invention is to have an apparatus suitable both for phototool generation and direct imaging onto photoresist (i.e., direct writing onto silicon wafers).

BRIEF DESCRIPTION OF THE DRAWINGS

These and other objectives of the invention will become apparent in the following description taken in connection with the drawings in which.

DESCRIPTION OF THE INVENTION

Figure 1:
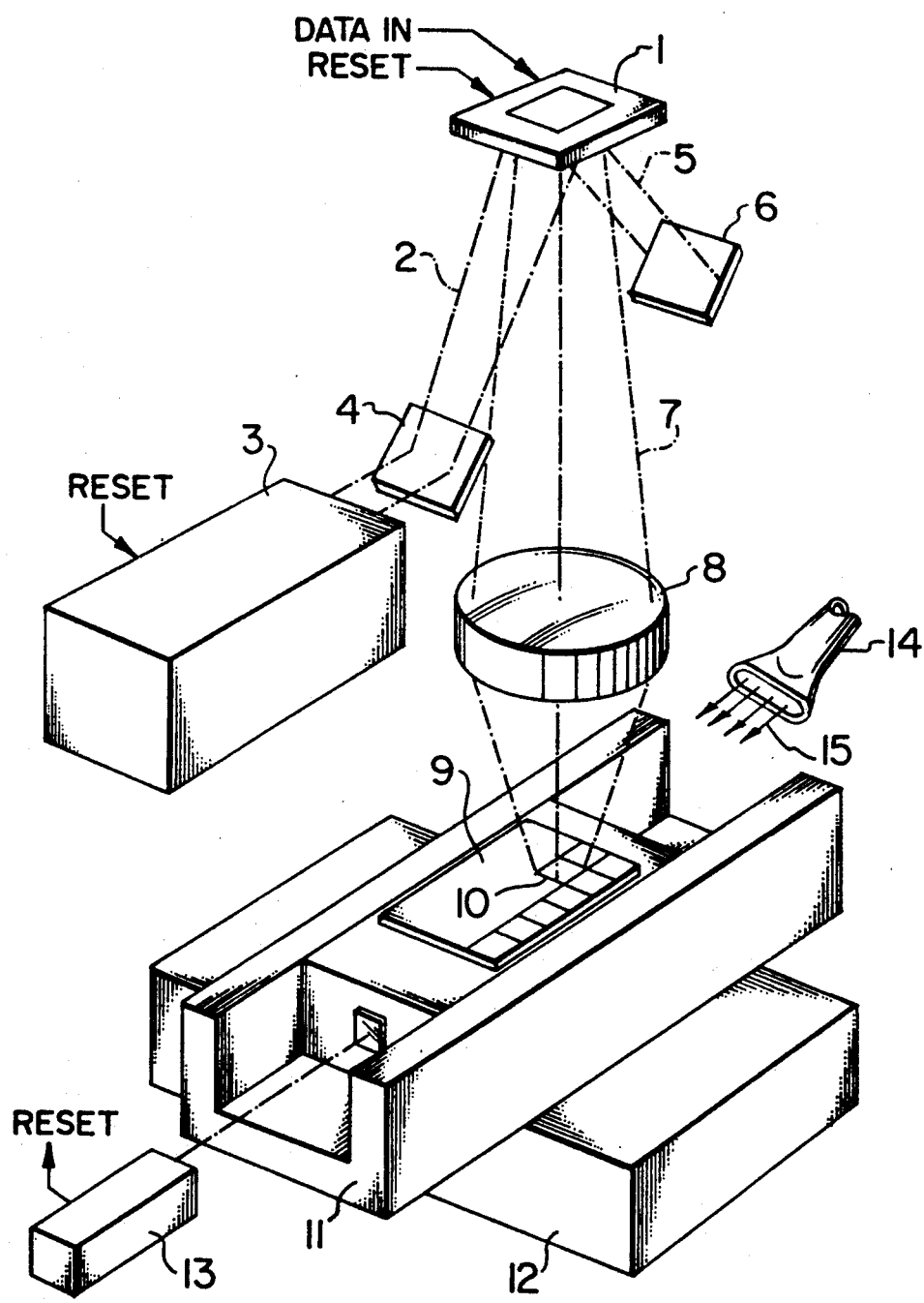
FIG. 1 is a schematic illustration of the preferred embodiment.

Referring to FIG. 1, a two dimensional deformable mirror spatial light modulator 1 is illuminated by a pulsed beam of light 2 generated by excimer laser 3 and directed by mirror 4 onto modulator 1. When the deformable mirrors in 1 are not activated the light beam 2 is reflected as light beam 5 towards absorber 6. The activated mirrors form beam 7 directed towards lens 8. Lens 8 forms an image 10 of the activated mirrors on coated substrate 9. Substrate 9 is moved in one direction by a precision stage 11 and in the other direction by a precision stage 12. The position of stage 11 is measured by an interferometer 13 and information provided by interferometer 13 is used to synchronize both the light pulse from excimer laser 3 and the data loading into modulator 1. The details of precision stages 11, 12 and interferometer 13 do not need to be given here since this type of X-Y stage is the common practice in the semiconductor industry. The only difference between the industry practice and the present invention in the area of precision stages is the fact that interferometer 13 is not used to control the position of Stage 11 but only to measure it and generate timing information based on the momentary position of stage 11. This is easier and more accurate than trying to control the position of stage 11.

The phototoool can be generated from substrate 9 in two different ways. The first is a conventional method of using a quartz/chrome/photoresist structure, exposing the photoresist and using it as a mask to etch the chrome. The same method is used when utilizing the invention to write on photoresist coated silicon wafers. The second method consists of coating a quartz substrate with a thin polymer layer, by the way of example, polyimide of about one micron thickness. This layer can be ablated by the excimer laser and form a phototool without requiring any further processing. In order to prevent formation of solid debris as an ablation by-product, a process gas 15 is supplied by nozzle 14 over the ablation area. The process gas can be an inert gas or an oxidizing gas. By the way of example, excimer laser 3 is a XeCl waveguide laser operating at 308 nm. The laser is made by Potomac Photonics Inc (Lanham, MD) and can generate up to 100 μJ per pulse at 1,000 Hz repetition rate. Using a deformable mirror modulator 1 having 1,000×1,000 elements on a 17 micron pitch (these numbers are typical of the modulators made by Texas Instruments Inc.) and a reduction lens of 85X, each pixel in exposed image 10 is 0.2×0.2 microns. The image size is 200×200 microns. The power density of the image 10 is equal to 0.1 mJ/0.02×0.02 $cm^2 = 0.255 J/cm^2$ which is sufficient for ablation. The power density on the modulator is a factor of $(85)^2 = 7,225$ less, which is sufficiently low not to damage the modulator. When the phototool is to be used for other wavelength, such as a g-line and i-line steppers, the optical density of the polyimide at the specific wavelength can be increased by the addition of a UV-absorbing dye.

When the finished phototool is used in an excimer laser stepper further ablation is eliminated since the typical reduction ratio in a stepper is 5× thus the power density on the phototool is a factor of 25 times lower than the power density on the wafer.

Figure 2:
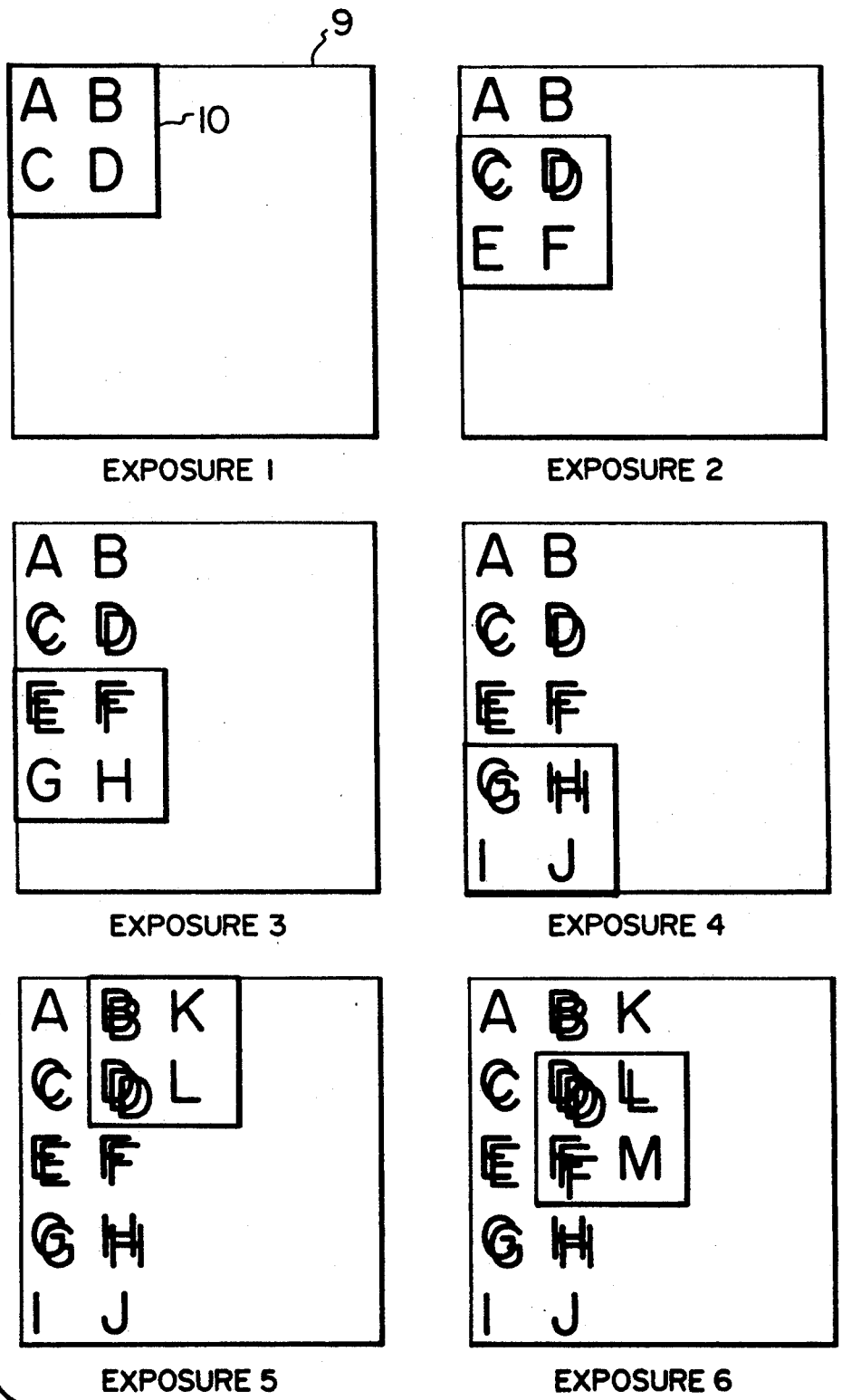
FIG. 2 shows the method of overlapping the written images used to increase the exposure uniformity.
Figure 3:
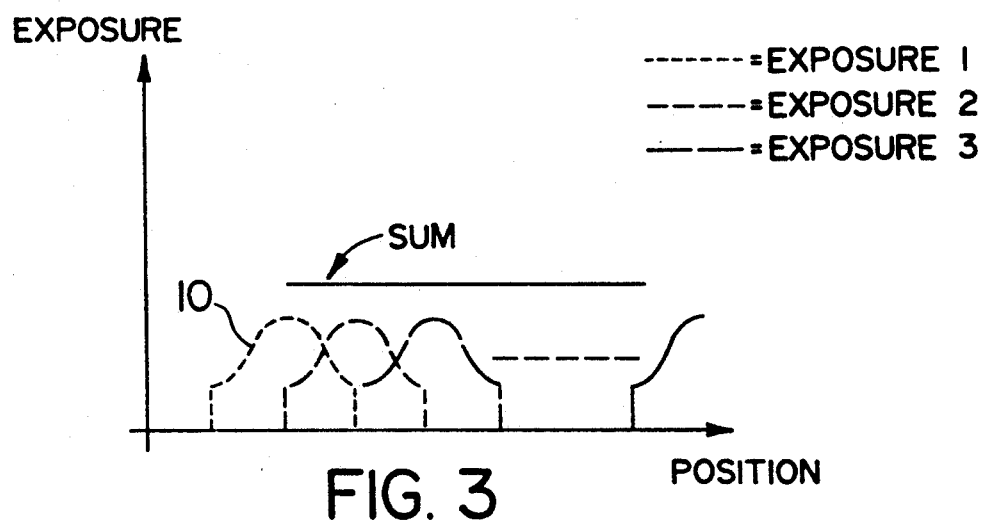
FIG. 3 is a graph showing the increase in exposure uniformity achieved by the overlapped exposure method.

Since the beam cross section of a waveguide excimer laser is not uniform and tends to be Gaussian at least in one dimension, some form of beam profile correction is required in order to achieve a uniform exposure. Referring now to FIG. 2, an overlap method is shown in which each spot is exposed four times. This tends to make the overall exposure very uniform for Gaussian and trapezoidal beams, as can be seen from exposure summation shown schematically in FIG. 3. Another advantage of multiple exposures comes from the fact that excimer laser ablation is a non-linear process and the first pulse of light tends to remove less material than subsequent pulses. In order to implement the exposure method shown in FIG. 3, the data has to be shifted in the modulator 1 in a direction opposite to the direction of travel of substrate 9. The shift of the data is synchronized to the motion of substrate 9 as follows. Referring now to FIG. 1 and FIG. 2 together and using the previous numerical example of a 1,000×1,000 pixel modulator imaged down by a ratio of 85× to form an area of 200×200 microns, a new exposure pulse has to be generated every 100 microns of travel of the substrate 9. The sequence of exposures is shown in FIG. 2. Interferometer 13 generates a pulse every 100 microns. This pulse triggers laser 3 to emit a very short (typically under 100 ns) pulse of light and starts the data loading process into the modulator. Since laser 3 operates at about 1,000 pulses per second, the data rate into the modulator is about 1 Gbit/second. The effective writing rate is 250 Mbit/second since each bit is exposed four times. For a larger modulator and faster repetition rate of the laser, effective writing rates in excess of 1 Gbit/sec are feasible. The velocity of travel for the substrate 9 is 100 micron per 1 ms or 100 mm/sec. At the end of each scan (typically 200 mm or 2 seconds) positioner 12 movers 100 microns in the orthogonal direction. After each exposure pulse the data is shifted in the modulator as shown in FIG. 2. The letters A,B,C, etc., in FIG. 2 symbolically represent data patterns loaded into the modulator.

Figure 4:
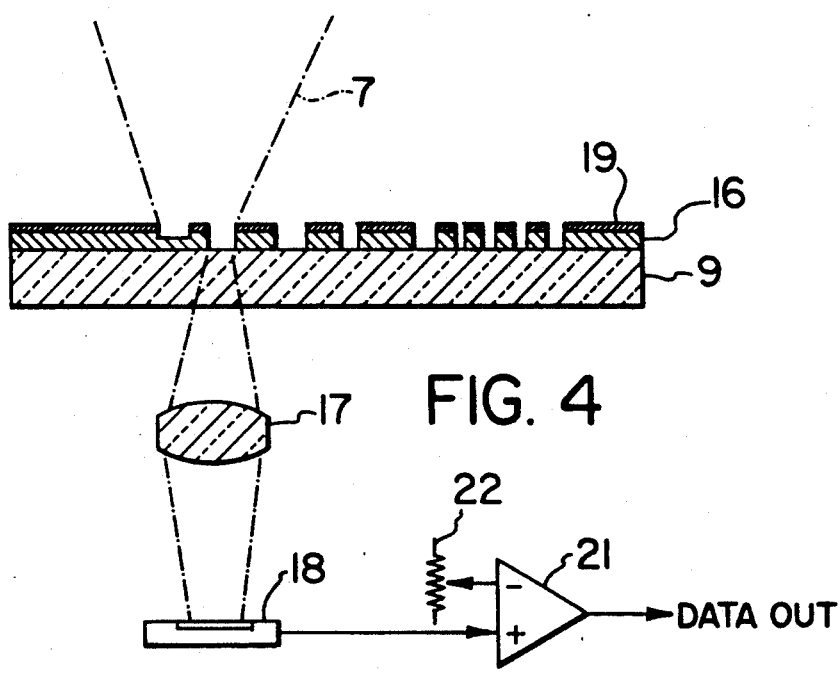
FIG. 4 is a cross section of the phototool also showing the inspection principle.

The structure of the phototool is shown in FIG. 4. A quartz substrate 9, with a typical thickness of 3 to 6 mm is coated with about one micron of polyimide 16. The polyimide may contain organic dyes to increase its optical density at specific wavelength such as the g-line or i-line. An overcoat 19 made of a polymer with higher ablation threshold can be added in order to increase the damage threshold when used in an excimer laser stepper. The thickness of overcoat 19 is a fraction of a micron, typically 0.1–0.2 micron. The ablation process is self-limiting when the quartz substrate is exposed.

Figure 5:
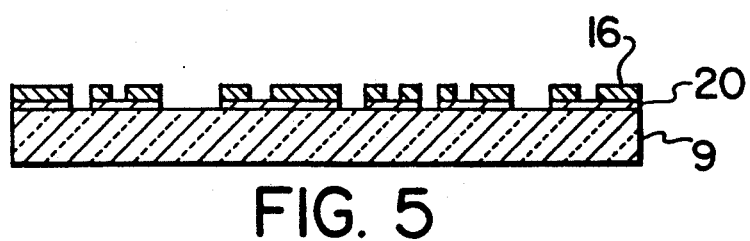
FIG. 5 is a cross section of the phototool when making phase-shift masks.

For increased resolution when used in a stepper, a type of mask known as a "Levenson type phase shift mask" can also be produced using the current invention. In this mask alternate clear features have an optical phase shift of 180° added to them. By the way of example a phase shift mask suitable for i-line steppers and compatible with the current invention is shown in FIG. 5. A quartz substrate 9 is coated with a layer of positive photoresist 20. The thickness of layer 20 is calculated to give exactly 180° phase shift at the i-line wavelength. On top of layer 20 a layer of polyimide 16 of about one micron is deposited. Using the different ablation rates of polyimide and positive photoresist and using multiple exposures the pattern can be cut in a way that alternate features are cut all the way to the quartz while the other features are only cut in the top layer. The finished mask is shown in cross section in FIG. 5. After completion the whole mask is exposed to strong i-line illumination from a mercury arc lamp. This causes the positive resist to become transparent to the i-line. By the way of example, a five minute flood exposure to an arc lamp will cause the phase shift layer to become 99% transparent to the i-line wavelength. The opaque layer 16 is not affected by the i-line.

An additional feature possible with the current invention is the verification of the phototool while it is being generated. This process is shown schematically in FIG. 4. A lens 17 images the completed part of the currently imaged area onto Charge Coupled Device (CCD) array 18. Using the example of FIG. 2, the completed part is the part receiving the fourth exposure. This part forms one quarter of the exposed area. Using a 250×250 elements CCD array to image the 250×250 pixel completed part of the current exposure, a high resolution is achieved for data verification and defect detection. This operation is widely used in optical data storage devices and is known as "read-after-write" and no further details of the data handling will be given. The analog output of the CCD is compared by a comparator 21 to a pre-set reference 22 and is turned into binary data. This data is compared to the data loaded into the modulator to generate a defect map for the written pattern.

By setting threshold 22 to a level representative of the threshold of the photo-resist to be used with this phototool (e.g. the photo-resist used on the silicon wafer when exposed in a stepper by this phototool) the performance of the mask can be evaluated quickly. This is of particular importance for phase-shift masks since their performance is harder to predict. If lens 17 in FIG. 4 has similar performance to the lens used in the stopper, the data coming out of comparator 21 will give a reliable indication of the performance of this mask in a stepper. For mask performance verification the resolution of CCD 18 has to be higher than the modulator, in order to minimize errors caused by quantization. For example, a 1,000 × 1,000 element CCD can be used in the previous example of imaging 250×250 bits.

What I claim is:

1. A system for recording data patterns on a planar substrate comprising:
    a laser operating in a pulsed mode;
    a deformable mirror array light modulator illuminated by said laser and means of loading said data patterns into said modulator;
    a reduction lens forming a reduced image of said modulator onto said substrate, said reduction lens positioned relative to said modulator in a manner allowing only light reflected by those of said deformable mirrors activated by said data pattern to reach said reduction lens;
    means of generating relative motion between said substrate and said reduction lens;

means of synchronizing said data patterns in said modulator and light pulses of said pulsed laser to said relative motion, in order to record said data patterns on a portion of said substrate larger than said reduced image, by combining a plurality of said reduced images;

a thin coating applied to said substrate capable of reacting with the said light pulses of said laser.

2. A system for recording data patterns on a planar substrate as claimed in claim 1 wherein said pulsed laser is an excimer waveguide laser.

3. A system for recording data patterns on a planar substrate as claimed in claim 1 wherein said planar substrate is a reticle used for the manufacturing of semiconductors.

4. A system for recording data patterns on a planar substrate as claimed in claim 1 wherein said planar substrate is a silicon wafer used in the manufacturing of semiconductors.

5. A system for recording data patterns on a planar substrate as claimed in claim 1 wherein said recording is done by ablation of a thin layer of Ultra-Violet absorbing dye deposited on the substrate and no further processing of said substrate is required after recording.

6. A system for recording of data patterns on a planar substrate as claimed in claim 1 wherein said recording is done by ablation of a thin layer of Ultra-Violet absorbing dye deposited on said substrate and said recorded data is verified by measuring the amount of light transmitted through the substrate immediately after recording said data.

7. a system for recording data patterns on a planar substrate and claimed in claim 1 wherein said recording is done by ablation of a thin layer of Ultra-Violet absorbing dye deposited on said substrate and said ablation is done in an atmosphere of a gas other than air.

8. A system for recording data patterns on a planar substrate as claimed in claim 1 wherein said substrate is coated with at least two thin layers of materials, one of said layers is used to shift the phase of light transmitted through the substrate while another layer forms an opaque mask capable of being recorded by said laser, and the combination of the substrate and said layers forms a phase-shifting mask.

9. A system for recording data patterns on a planar substrate as claimed in claim 1 wherein said substrate is coated with at least two thin layers of materials, one of said layers is used to shift the phase of light transmitted through the substrate while another layer forms an opaque mask capable of being ablated by said laser, and the combination of said layers forming a phase-shifting mask which can be verified by measuring the amount of light transmitted through the substrate after recording said data.

* * * * *